United States Patent
Furukawa

(10) Patent No.: US 9,337,216 B2
(45) Date of Patent: May 10, 2016

(54) SUBSTRATE DEVICE AND METHOD FOR MANUFACTURING SAME

(71) Applicant: Sharp Kabushiki Kaisha, Osaka-shi, Osaka (JP)

(72) Inventor: Hiroaki Furukawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/433,906

(22) PCT Filed: Oct. 9, 2013

(86) PCT No.: PCT/JP2013/077519
§ 371 (c)(1),
(2) Date: Apr. 7, 2015

(87) PCT Pub. No.: WO2014/061531
PCT Pub. Date: Apr. 24, 2014

(65) Prior Publication Data
US 2015/0270292 A1  Sep. 24, 2015

(30) Foreign Application Priority Data

Oct. 16, 2012  (JP) ................................. 2012-229092

(51) Int. Cl.
| | | |
|---|---|---|
| *H01L 21/311* | (2006.01) | |
| *H01L 27/12* | (2006.01) | |
| *G02F 1/1362* | (2006.01) | |
| *H01L 29/66* | (2006.01) | |
| *H01L 29/786* | (2006.01) | |

(52) U.S. Cl.
CPC ...... *H01L 27/1248* (2013.01); *G02F 1/136286* (2013.01); *H01L 27/124* (2013.01); *H01L 27/1296* (2013.01); *H01L 29/66757* (2013.01); *H01L 29/7866* (2013.01); *H01L 29/78609* (2013.01)

(58) Field of Classification Search
CPC ............ H01L 21/762; H01L 21/02332; H01L 21/048; H01L 21/02129; H01L 21/467; H01L 21/475; H01L 21/31683; H01L 21/31641; H01L 23/49531; H01L 24/85; H01L 27/0629; H01L 27/1251; H01L 27/3248; H01L 27/5288; H01L 29/7816; H01L 51/442; H01L 51/102; H01L 51/0508
USPC ........ 438/270, 637, 700, 680, 149, 524, 576, 438/608, 719, 753, 723, 756, 769, 942; 257/359, 396, 622, 649, 774, E21.006, 257/E21.027, E21.061, E21.17, E21.129, 257/E21.206, E21.2, E21.267, E21.278, 257/E21.332, E21.37, E21.411, E21.545
See application file for complete search history.

(56) References Cited

U.S. PATENT DOCUMENTS

| | | | |
|---|---|---|---|
| 7,612,849 B2 * | 11/2009 | Eguchi | G02F 1/133555 349/114 |
| 9,057,920 B2 * | 6/2015 | Eguchi | G02F 1/133555 |

FOREIGN PATENT DOCUMENTS

| | | |
|---|---|---|
| JP | 11-024101 A | 1/1999 |
| JP | 11-153809 A | 6/1999 |
| JP | 2009-128761 A | 6/2009 |

* cited by examiner

*Primary Examiner* — David Nhu
(74) *Attorney, Agent, or Firm* — Keating & Bennet, LLP

(57) ABSTRACT

The present invention allows a current leakage path to be reliably disconnected even when a conductive film residue occurs between data wiring lines. An interlayer insulating film of a TFT panel includes an interlayer insulating film opening at a position corresponding to a pattern edge of an insulating protective film.

5 Claims, 19 Drawing Sheets

Prior Art

Prior Art

SUBSTRATE DEVICE AND METHOD FOR MANUFACTURING SAME

TECHNICAL FIELD

The present invention relates to a substrate device and a method for producing the substrate device. In particular, the present invention relates to a technique for forming a conductive pattern of a substrate device.

BACKGROUND ART

In general, in producing a TFT (Thin Film Transistor), a thick insulating protective film (organic resin film in general) is laminated on data wiring lines/terminal wiring lines and then a conductive film (transparent electrode film) pattern is formed in an upper layer of the thick insulating protective film.

FIG. 20 is a cross sectional view illustrating an ideal TFT panel 300 which would be produced in a production method including the film formation and pattern formation step as above. FIG. 21 is a schematic view illustrating the TFT panel 300 viewed directly from above. FIG. 22 is a cross sectional view illustrating the TFT panel 300 taken along A-B in FIG. 21. These drawings show that individual ones of data wiring lines/terminal wiring lines 7 are electrically insulated from each other. As illustrated in FIGS. 20 through 22, it is ideal that individual ones of the data wiring lines/terminal wiring lines 7 of the TFT panel 300 are electrically insulated from each other.

However, in reality, in a case of a conventional TFT panel having the same configuration as that of the ideal TFT panel 300, when a thick insulating protective film 8 is stacked on the data wiring lines/terminal wiring lines 7 and a pattern of a transparent electrode film 9 is formed on the thick insulating protective film 8, a current leakage path tends to be formed between the data wiring lines/terminal wiring lines 7.

FIGS. 23 through 25 each illustrate an example of a conventional TFT panel 200 which is produced in practice in a TFT array step in which the thick insulating protective film 8 is stacked. FIGS. 23 through 25 correspond to FIGS. 20 through 22, respectively. FIG. 23 is a cross sectional view illustrating the TFT panel 200. FIG. 24 is a schematic view illustrating the TFT panel 200 viewed directly from above. FIG. 25 is a cross sectional view illustrating the TFT panel 200 taken along A-B in FIG. 24.

As illustrated in FIGS. 23 through 25, lamination of the thick insulating protective film 8 on the data wiring lines/terminal wiring lines 7 tends to consequently leave a transparent electrode film residue 91 along a pattern edge 81 of the insulating protective film 8. In a case where the transparent electrode film residue 91 remains between the data wiring lines/terminal wiring lines 7 which are not covered with the insulating protective film 8, the transparent electrode film residue 91 forms a current leakage circuit. This causes an electric short-circuit between the data wiring lines/terminal wiring lines 7.

FIGS. 26 through 28 are views illustrating a cause for the transparent electrode film residue 91 which is formed between the data wiring lines/terminal wiring lines 7 and along the pattern edge 81 of the insulating protective film 8. FIG. 26 is a cross sectional view illustrating a state immediately after formation of a transparent electrode film 90 on the thick insulating protective film 8. FIG. 27 is a cross sectional view illustrating a state where a resist is applied onto the transparent electrode film 90 after the state illustrated in FIG. 26. FIG. 28 is a cross sectional view illustrating a state where a residue of the applied resist remains along the pattern edge of the insulating protective film 8.

As illustrated in FIG. 26, when the transparent electrode film 90 is formed, a portion of the transparent electrode film 90 tends to become thick along a height direction H at the pattern edge 81 of the insulating protective film 8. In a case where the portion along the height direction H becomes thick, pattern etching cannot completely remove an unnecessary portion of the transparent electrode film 90 which portion is between the data wiring lines/terminal wiring lines 7. This results in the transparent electrode film residue 91 after the pattern etching.

Similarly, as illustrated in FIG. 27, in a photolithograph step of forming a transparent electrode film pattern, a portion of the applied resist has a large thickness along the height direction of the insulating protective film 8, as with the transparent electrode film 90. Consequently, as illustrated in FIG. 28, exposure to that portion becomes insufficient, which results in residue of the resist after development. The residue of the resist results in the transparent electrode film residue 91 after etching.

The transparent electrode film residue 91 forms a current leakage circuit between the data wiring lines/terminal wiring lines 7 which are not covered with the insulating protective film 8, because of what is described with reference to FIG. 26 and what is described with reference to FIGS. 27 and 28.

The above description has discussed (i) the transparent electrode film residue 91 which is formed along the pattern edge 81 of the insulating protective film 8 and (ii) formation of a current leakage path between the data wiring lines/terminal wiring lines 7 by the transparent electrode film residue 91. The above description uses, as an example, a top-gate structure TFT panel.

However, the problems of (i) the transparent electrode film residue 91 which is formed along the pattern edge 81 of the insulating protective film 8 and (ii) formation of a current leakage path between the data wiring lines/terminal wiring lines 7 by the transparent electrode film residue 91 are not limited to the top-gate structure TFT panel.

FIG. 19 is a cross sectional view illustrating a structure of an ideal bottom-gate structure TFT panel 400.

As can be seen from the shape of an insulating protective film 8 in the TFT panel 400, the bottom-gate structure TFT panel 400 also tends to have a transparent electrode film residue 91 along a pattern edge 81 of the insulating protective film 8. That is, the problems of (i) formation of the transparent electrode film residue 91 and (ii) formation of a current leakage path between the data wiring lines/terminal wiring lines 7 by the transparent electrode film residue 91 also occur in the bottom-gate structure TFT panel.

As such, various measures have been taken in order to prevent data wiring lines/terminal wiring lines from being electrically short-circuited even when an insulating protective film is deposited to have a large thickness.

Patent Literature 1 below discloses a technique for preventing a short-circuit between the mounted terminals. In this technique, an end of an interlayer insulating film between mounted terminals is formed to have a protruding shape, so that residue of a pixel electrode material at a pattern edge portion is reduced and thereby, the short-circuit between the mounted terminals is prevented.

Patent Literature 2 discloses a technique in which a photomask for forming an interlayer insulating film is designed to have a light-blocking pattern which blocks light from an exposing device, an opening pattern which allows the light to pass, and a boundary pattern which is between the light-blocking pattern and the opening pattern and which has a pitch smaller than a resolution of the exposing device. Patent Literature 2 is intended to prevent an electric short-circuit caused by a residue of a pixel electrode between adjacently mounted terminals at an end of the gate insulating film, by making an inclination angle gentle at an end of the insulating film with use of the above photomask.

Patent Literature 3 discloses a substrate device including a single-layered pattern film which is formed on a substrate and which has a side surface section. The side surface section is formed to have a plurality of inclination angles with respect to a surface of the substrate or the side surface section is formed to have a step-like form.

CITATION LIST

Patent Literatures

[Patent Literature 1]
Japanese Patent Application Publication, Tokukaihei, No. 11-24101 A (published on Jan. 29, 1999)
[Patent Literature 2]
Japanese Patent Application Publication, Tokukaihei, No. 11-153809 A (published on Jun. 8, 1999)
[Patent Literature 3]
Japanese Patent Application Publication, Tokukai, No. 2009-128761 A (published on Jun. 11, 2009)

SUMMARY OF INVENTION

Technical Problem

However, the conventional techniques as above have a problem that they do not reliably realize disconnection of a current leakage path.

Specifically, the technique of Patent Literature 1 has a problem that since the organic insulating film is patterned with photolithography, it is difficult to correctly resolve a pattern and this may deform a protruding shape in a case where the organic film is thick. That is, the method in which an edge of an organic insulating film is formed to have a protruding shape, as disclosed in Patent Literature 1, is a method which decreases a probability of the occurrence of a conductive film residue by utilizing a tendency that an upper electrode film is more likely to remain at a depressed portion of the patterned edge and less likely to remain at a protruding portion of the patterned edge. Accordingly, this method does not reliably disconnect a current leakage path.

The technique disclosed in Patent Literature 2 makes an inclination angle gentle at an end of the insulating film, by deteriorating accuracy in reproducing an outline of the interlayer insulating material film in etching with use of a photomask having a boundary pattern whose pitch is smaller than a resolution of the exposing device. By making the inclination angle gentle at the end of the insulating film, the technique prevents a resist residue from occurring in the vicinity of the end of the interlayer insulating film. However, although it is highly probable with use of the photomask that (i) accuracy in reproducing an outline is deteriorated, (ii) the angle of inclination of the end of the insulating film is made gentle, (iii) the occurrence of a resist residue is prevented, and (iv) the occurrence of a residue of a pixel electrode is prevented, it is unclear how reliably a current leakage path can be disconnected.

As for the invention described in Patent Literature 3, a plurality of inclination angles or level differences formed at the side surface section of the pattern film do not reliably prevent the occurrence of a film residue.

The present invention was made in view of the foregoing problems. An object of the present invention is to reliably disconnect a current leakage path in a case where a residue of a conductive film occurs between data wiring lines.

Solution to Problem

In order to solve the foregoing problems, a substrate device in accordance with one aspect of the present invention is a substrate device including: a first insulating film; a plurality of wiring lines which extend on a surface of the first insulating film, the plurality of wiring lines being adjacent to each other so as to have a predetermined distance therebetween; a second insulating film which covers all of respective portions of the plurality of wiring lines, so that a slope of the second insulating film is formed on the plurality of wiring lines, the respective portions of the plurality of wiring lines each having a length that is a part of an entire length of each of the plurality of wiring lines; and a conductive pattern formed on a surface of the second insulating film, the surface of the first insulating film having an opening which is provided at a position (1) that corresponds to the slope of the second insulating film and (2-a) that corresponds to at least one of two adjacently extending wiring lines of the plurality of wiring lines or (2-b) that is between two adjacently extending wiring lines of the plurality of wiring lines.

In order to solve the foregoing problems, a method in accordance with one aspect of the present invention for producing a substrate device is a method for producing a substrate device, the substrate device including: a first insulating film; a plurality of wiring lines which extend on a surface of the first insulating film, the plurality of wiring lines being adjacent to each other so as to have a predetermined distance therebetween; a second insulating film which covers all of respective portions of the plurality of wiring lines, so that a slop of the second insulating film is formed on the plurality of wiring lines, the respective portions of the plurality of wiring lines each having a length that is a part of an entire length of each of the plurality of wiring lines; and a conductive pattern formed on a surface of the second insulating film, the method including the steps of: forming, on the surface of the first insulating film, an opening in such a manner that the opening is provided at a position (1) that corresponds to the slope of the second insulating film and (2-a) that corresponds to at least one of two adjacently extending wiring lines of the plurality of wiring lines or (2-b) that is between two adjacently extending wiring lines of the plurality of wiring lines; forming, on the surface of the first insulating film, the plurality of wiring lines extending so that the plurality of wiring lines are adjacent to each other with the predetermined distance therebetween; and forming the second insulating film which covers all of respective portions of the plurality of wiring lines in such a manner that the slope of the second insulating film is formed on the plurality of wiring lines, and the slope reaches inside the opening.

Advantageous Effects of Invention

With one aspect of the present invention, the residue between the wiring lines, which has occurred along the slope of the second insulating film, moves to the bottom of the opening. This reliably disconnects a current leakage path between the wiring lines which path might be formed by the residue.

BRIEF DESCRIPTION OF DRAWINGS

FIG. 15 illustrates the presence of a transparent electrode film residue at a bottom of an interlayer insulating film opening.

FIG. 26 illustrates that a transparent electrode film tends to have a large film thickness in a height direction when formed.

FIG. 27 illustrates that in a photolithograph step of forming a transparent electrode film pattern, an applied resist tends to have a large thickness along an insulating protective film.

DESCRIPTION OF EMBODIMENTS

The following description will discuss embodiments of the present invention in details with reference to FIGS. 1 through 29.

[First Embodiment]

Figure 1:
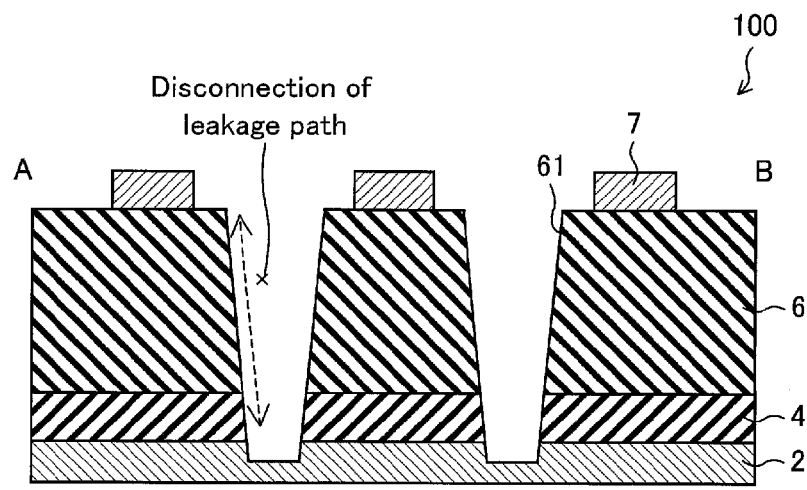
FIG. 1 is a cross sectional view illustrating a substrate device in accordance with one aspect of the present invention. A-B in FIG. 1 corresponds to A-B in FIG. 2.

FIG. 1 is a cross sectional view illustrating a TFT (Thin Film Transistor) panel 100 which is a substrate device in accordance with one aspect of the present invention. FIG. 1 illustrates that in the TFT panel 100, an interlayer insulating film opening 61 (opening) is provided in an interlayer insulating film 6 (first insulating film) between the data wiring lines/terminal wiring lines 7.

Figure 2:
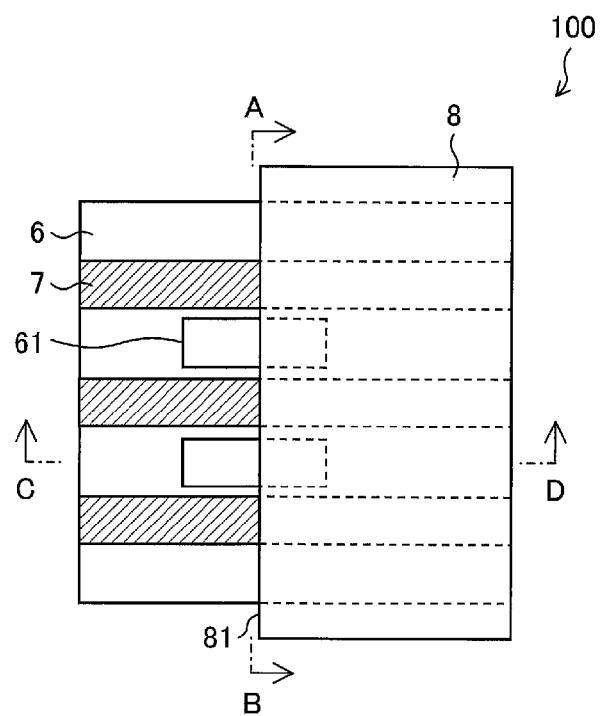
FIG. 2 is a schematic view illustrating the substrate device in FIG. 1, viewed directly from above. A-B in FIG. 2 corresponds to A-B in FIG. 1. C-D in FIG. 2 corresponds to C-D in FIG. 3.

FIG. 2 is a schematic view illustrating the TFT panel 100 viewed directly from above. A-B in FIG. 2 corresponds to A-B in FIG. 1. A-B corresponds to a pattern edge 81 of an insulating protective film 8.

Figure 3:
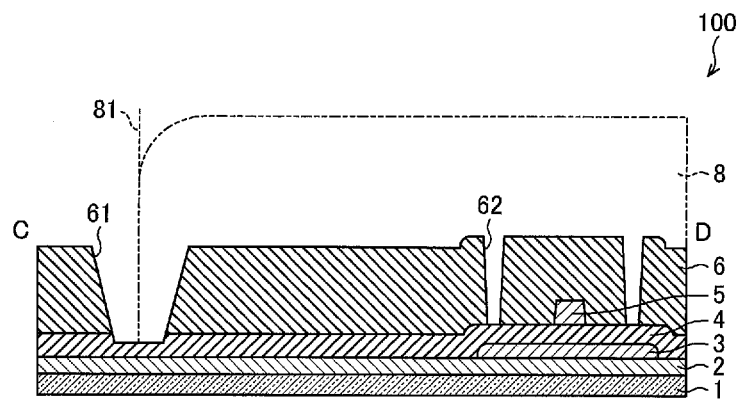
FIG. 3 is a cross sectional view illustrating the substrate device taken along C-D in FIG. 2.

FIG. 3 is a cross sectional view illustrating the TFT panel 100 taken along C-D in FIG. 2.

A substrate device in accordance with one aspect of the present invention is a substrate device comprising: a first insulating film (interlayer insulating film 6); a plurality of wiring lines (data wiring lines/terminal wiring lines 7) which extend on a surface of the first insulating film (interlayer insulating film 6), the plurality of wiring lines being adjacent to each other so as to have a predetermined distance therebetween; a second insulating film (insulating protective film 8) which covers all of respective portions of the plurality of wiring lines, so that a slope (insulating protective film pattern edge 81) of the second insulating film is formed on the plurality of wiring lines, the respective portions of the plurality of wiring lines each having a length that is a part of an entire length of each of the plurality of wiring lines; and a conductive pattern (transparent electrode 9) formed on a surface of the second insulating film, the surface of the first insulating film having an opening (interlayer insulating film opening 61) which is provided at a position (1) that corresponds to the slope of the second insulating film and (2-a) that corresponds to at least one of two adjacently extending wiring lines of the plurality of wiring lines or (2-b) that is between two adjacently extending wiring lines of the plurality of wiring lines.

Figure 4:
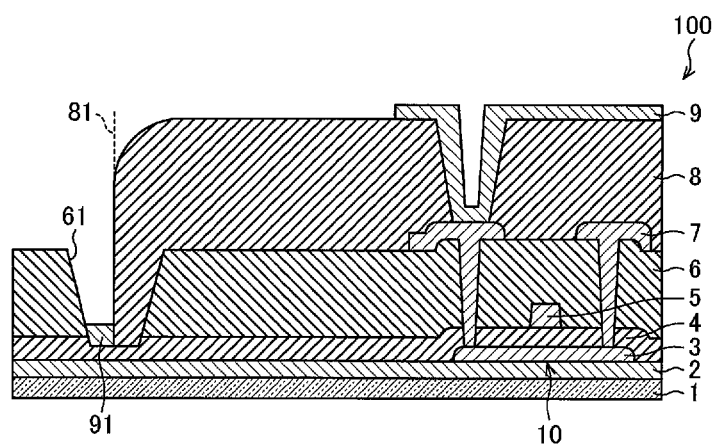
FIG. 4 is a cross sectional view illustrating the substrate device in FIG. 1, in which a transparent electrode film residue having occurred along a pattern edge of an insulating protective film is accumulated at a bottom of an interlayer insulating film opening.

In FIG. 4 etc., the slope (insulating protective film pattern edge 81) is illustrated as being perpendicular to a glass substrate 1 (described later). However, in the substrate device in accordance with one aspect of the present invention, the slope may be perpendicular or may be inclined with respect to the glass substrate 1.

The following description first discusses a substrate device in accordance with one aspect of the present invention. The substrate device discussed here has a structure in which an opening (interlayer insulating film opening 61) is formed between two adjacent extending wiring lines out of the plurality of wiring lines (data wiring lines/terminal wiring lines 7). The following description uses the TFT panel 100 as an example.

(Top-Gate Structure TFT Panel 100 of Present Invention)

In the TFT panel 100, the interlayer insulating film 6 has the interlayer insulating film opening 61 at a position that corresponds to the pattern edge 81 (slope) of the insulating protective film 8 (second insulating film). Furthermore, the interlayer insulating film opening 61 is provided between the data wiring lines/terminal wiring lines 7 (wiring lines).

As a result of providing the interlayer insulating film opening 61, even when the transparent electrode film residue 91 occurs between the data wiring lines/terminal wiring lines 7 and along the pattern edge 81 of the insulating protective film 8, the transparent electrode film residue 91 moves to a bottom of the interlayer insulating film opening 61. Consequently, in the TFT panel 100, a current leakage path between the data wiring lines/terminal wiring lines 7, which path would be formed due to the transparent electrode film residue 91 between the data wiring lines/terminal wiring lines 7, is disconnected reliably.

In order to reliably disconnect the current leakage path between the data wiring lines/terminal wiring lines 7, which path would be formed due to the transparent electrode film residue 91, the interlayer insulating film 6 of the TFT panel 100 is designed to have the interlayer insulating film opening 61 at a position corresponding to the pattern edge 81 of the insulating protective film 8, as illustrated in FIGS. 1 through 3. In the TFT panel 100, since the opening (interlayer insulating film opening 61) of the interlayer insulating film 6 is provided between the data wiring lines/terminal wiring lines 7, it is possible to disconnect a current leakage path between the data wiring lines/terminal wiring lines 7 even when a conductive film residue (transparent electrode film residue 91) occurs.

FIG. 4 is a cross sectional view illustrating the TFT panel 100 in which the transparent electrode film residue 91 having occurred along the pattern edge 81 of the insulating protective film 8 is accumulated at the bottom of the interlayer insulating film opening 61.

Figure 5:
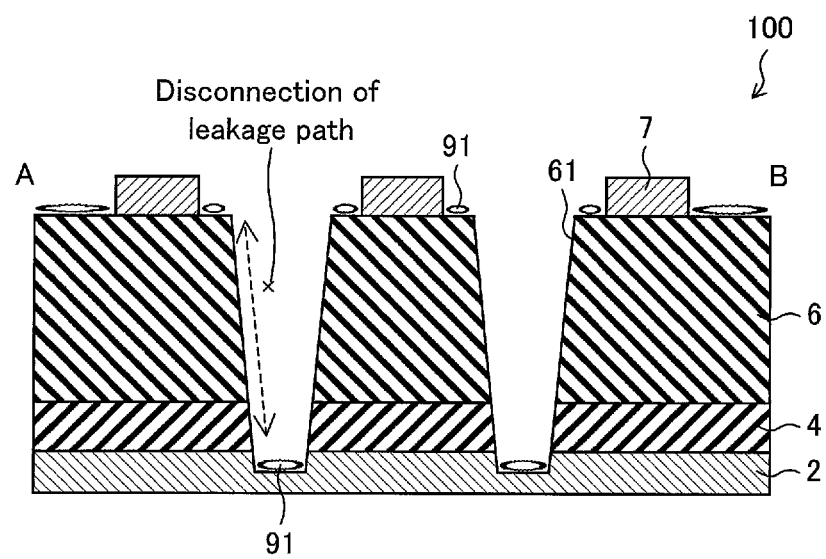
FIG. 5 is a cross sectional view illustrating the substrate device in FIG. 1, in which the interlayer insulating film opening reliably disconnects a current leakage circuit between data wiring lines/terminal wiring lines, which circuit is formed due to the transparent electrode film residue.

FIG. 5 is a cross sectional view illustrating the TFT panel 100 in which the interlayer insulating film opening 61 reliably disconnects the current leakage circuit between the data wiring lines/terminal wiring lines 7, which circuit would be formed due to the transparent electrode film residue 91.

As illustrated in FIG. 4, the TFT panel 100 includes a top-gate structure thin film transistor 10. The thin film transistor 10 includes a silicon film 3, the data wiring lines/terminal wiring lines 7 electrically connected with the silicon film 3, a gate insulating film 4, and a gate electrode 5 provided on the gate insulating film 4. A drain electrode of the thin film transistor 10 is electrically connected with the silicon film 3 and the transparent electrode 9.

As illustrated in FIG. 5, even when the transparent electrode film residue 91 remains at an edge between A and B, the current leakage path is disconnected due to a level difference formed by the interlayer insulating film opening 61. This prevents an electric short-circuit from occurring between adjacent ones of the data wiring lines/terminal wiring lines 7.

In other words, A-B in FIG. 5 corresponds to the pattern edge 81 of the insulating protective film 8, and as described above, the transparent electrode film residue 91 tends to occur between A and B, i.e. at the pattern edge 81 of the insulating protective film 8 in the steps of producing a TFT panel. The transparent electrode film residue 91 which has occurred between A and B results in formation of a current leakage path between the data wiring lines/terminal wiring lines 7. However, provision of the interlayer insulating film opening 61 reliably disconnects the current leakage path between the data wiring lines/terminal wiring lines 7 by a level difference formed by the interlayer insulating film opening 61, i.e. by a difference in height between a top surface of the interlayer insulating film 6 and a bottom of the interlayer insulating film opening 61.

In the TFT panel 100, the interlayer insulating film opening 61 is provided in the interlayer insulating film 6 in such a manner as to be at a position which corresponds to the pattern edge 81 of the insulating protective film 8. Consequently, even in a case where the transparent electrode film residue 91 occurs along the pattern edge 81 of the insulating protective film 8, the transparent electrode film residue 91 which has thus occurred moves to the bottom of the interlayer insulating film opening 61. That is, in the TFT panel 100, it is possible to reliably disconnect, with use of the interlayer insulating film opening 61, the current leakage path between the data wiring lines/terminal wiring lines 7 which path would be formed due to the transparent electrode residue 91.

Features of the TFT panel 100 as described above are summarized as follows.

The occurrence of the transparent electrode film residue 91 at the pattern edge 81 of the insulating protective film 8 results in formation of the current leakage path between the data wiring lines/terminal wiring lines 7.

In order to prevent this, the interlayer insulating film opening 61 is provided in the interlayer insulating film 6 between the data wiring lines/terminal wiring lines 7. By providing the interlayer insulating film 6 with the interlayer insulating film opening 61, the transparent electrode film residue 91 moves to the interlayer insulating film opening 61 of the interlayer insulating film 6. This ultimately disconnects the current leakage path between the data wiring lines/terminal wiring lines 7.

Figure 20:
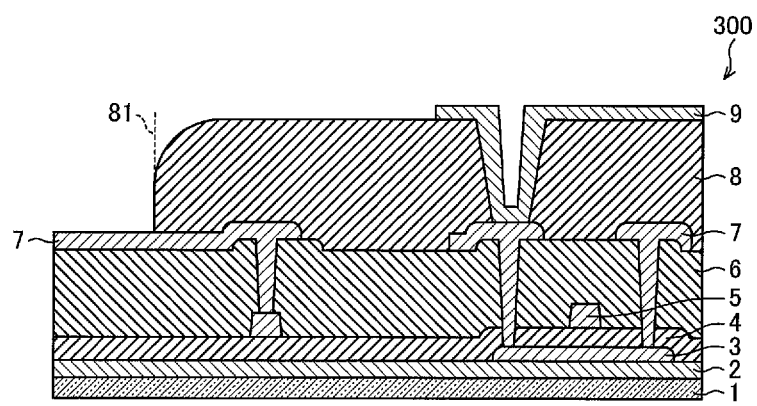
FIG. 20 is a cross sectional view illustrating an ideal top-gate structure substrate device.
Figure 21:
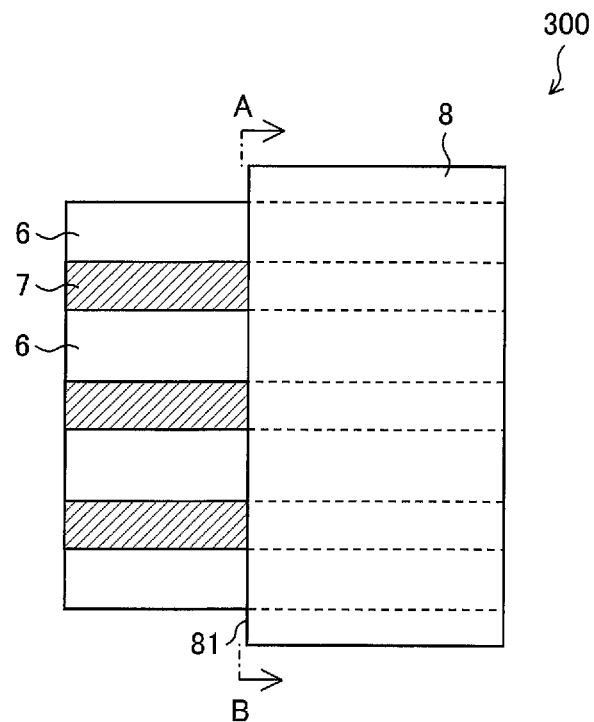
FIG. 21 is a schematic view illustrating the ideal substrate device in FIG. 20, viewed directly from above.
Figure 22:
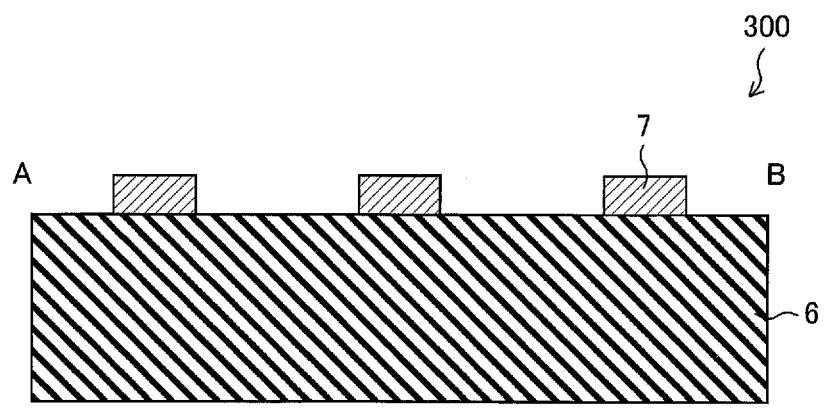
FIG. 22 is a cross sectional view illustrating the ideal substrate device taken along A-B in FIG. 21.
Figure 23:
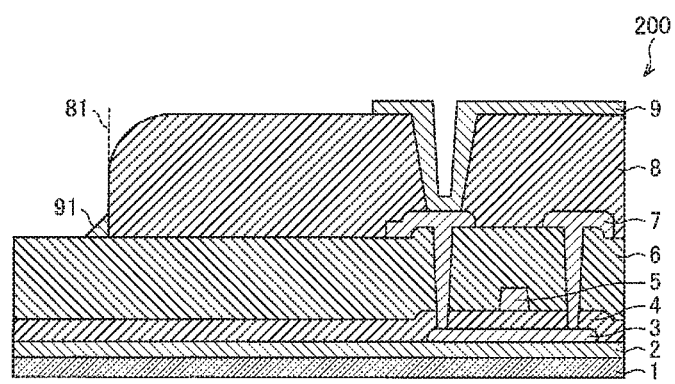
FIG. 23 is a cross sectional view illustrating a conventional substrate device.
Figure 24:
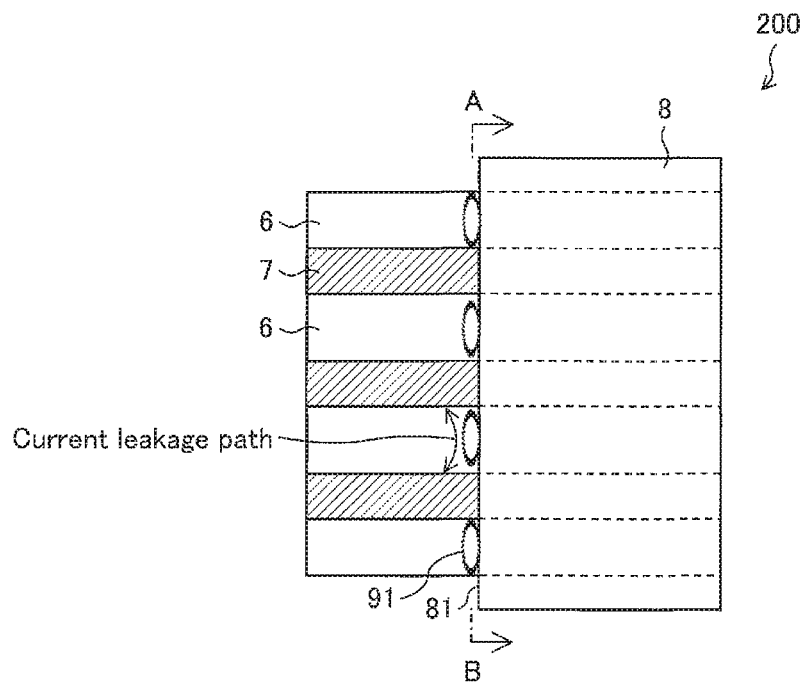
FIG. 24 is a schematic view illustrating the substrate device in FIG. 23, viewed directly from above.
Figure 25:
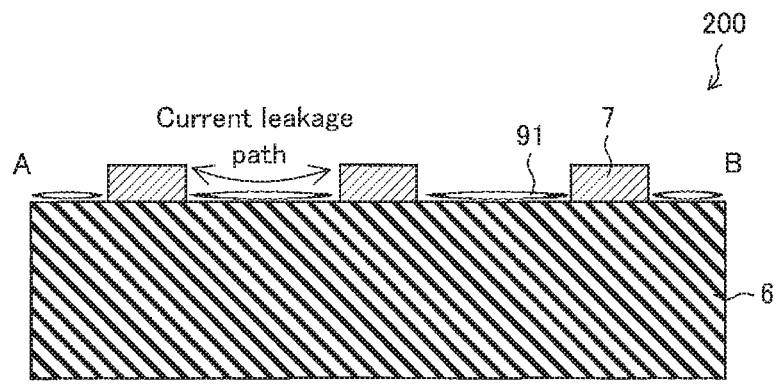
FIG. 25 is a cross sectional view illustrating the conventional substrate device in FIG. 23 taken along A-B in FIG. 24.
Figure 26:
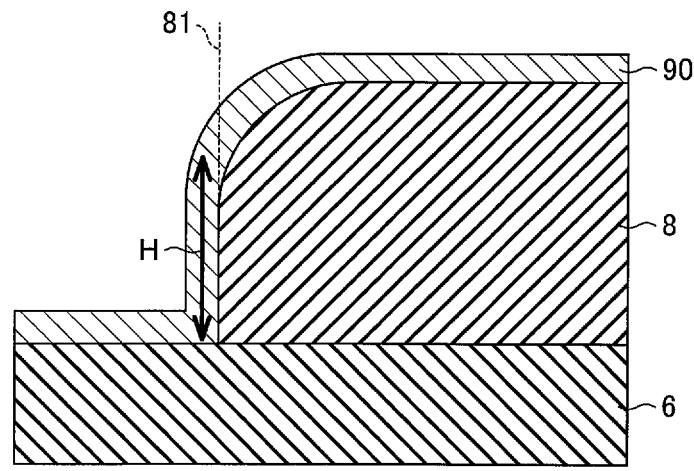
FIG. 26 is a view illustrating a cause of the occurrence of a transparent electrode film residue between data wiring lines/terminal wiring lines.
Figure 27:
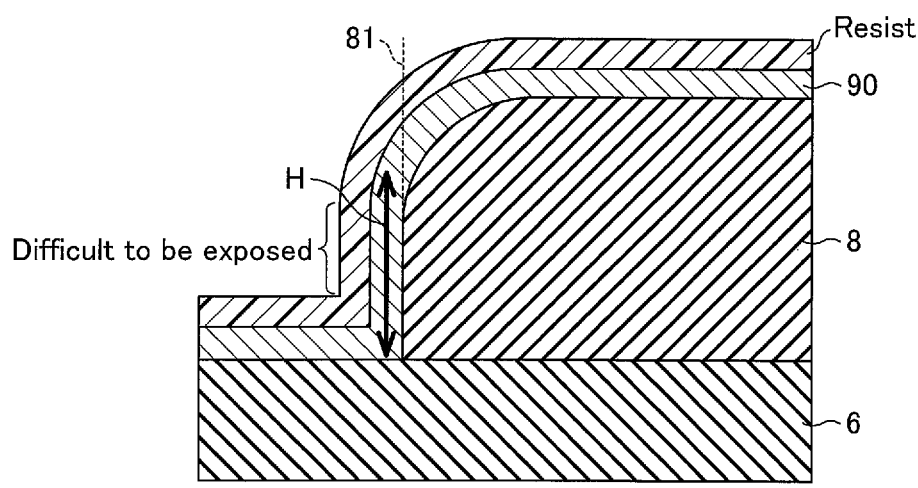
FIG. 27 is a view illustrating a cause of the occurrence of a transparent electrode film residue between data wiring lines/terminal wiring lines.
Figure 28:
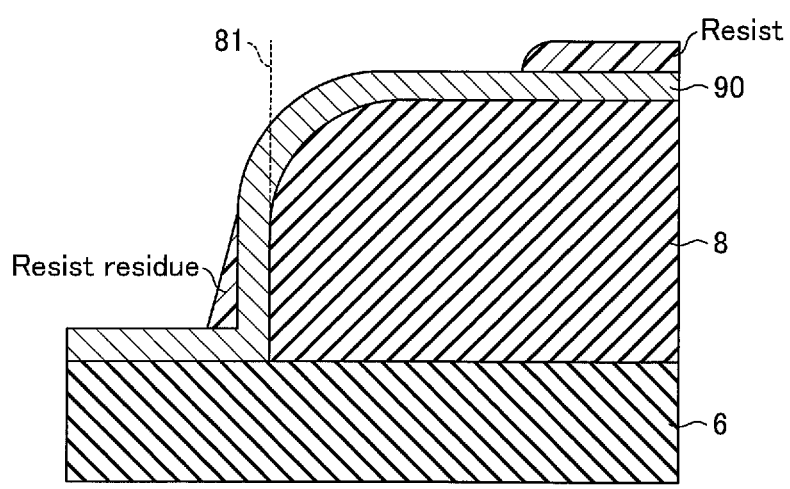
FIG. 28 is a view illustrating that when the applied resist has a large thickness along the insulating protective film as illustrated in FIG. 27, exposure becomes insufficient and a resist residue occurs after development.

A configuration of a cross section of the TFT panel 100 taken along a plane that cuts the data wiring lines/terminal wiring lines 7 in a longitudinal direction of the data wiring lines/terminal lines 7 is similar to that of the cross section illustrated in FIG. 20. That is, the pattern edge 81 (slope) of the insulating protective film 8 (second insulating film) is formed on the data wiring lines/terminal wiring lines 7.

The following description will discuss how to produce the TFT panel 100 having the above configuration.

(Method of Producing TFT Panel 100)

A method in accordance with one aspect of the present invention for producing a substrate device is a method of producing a substrate device, the substrate device including: a first insulating film (interlayer insulating film 6); a plurality of wiring lines (data wiring lines/terminal wiring lines 7) which extend on a surface of the first insulating film, the plurality of wiring lines being adjacent to each other so as to have a predetermined distance therebetween; a second insulating film (insulating protective film 8) which covers all of respective portions of the plurality of wiring lines, so that a slop (insulating protective film pattern edge 81) of the second insulating film is formed on the plurality of wiring lines, the respective portions of the plurality of wiring lines each having a length that is a part of an entire length of each of the plurality of wiring lines; and a conductive pattern (transparent electrode 9) formed on a surface of the second insulating film, the method including the steps of: forming, on the surface of the first insulating film, an opening in such a manner that the opening is provided at a position (1) that corresponds to the slope of the second insulating film and (2-a) that corresponds to at least one of two adjacently extending wiring lines of the plurality of wiring lines or (2-b) that is between two adjacently extending wiring lines of the plurality of wiring lines (contact-hole-patterning step TS7); forming, on the surface of the first insulating film, the plurality of wiring lines extending so that the plurality of wiring lines are adjacent to each other with the predetermined distance therebetween; and forming the second insulating film which covers all of respective portions of the plurality of wiring lines in such a manner that the slope of the second insulating film is formed on the plurality of wiring lines, and the slope reaches inside the opening.

As detailed later, in a case where the method in accordance with one aspect of the present invention for producing a substrate device is applied to production of a TFT panel, at the same time as a contact hole is formed in an interlayer insulating film, an opening is formed in an insulating film at a position which is to be below a portion of an insulating protective film which portion is to become a pattern edge. Accordingly, the method in accordance with one aspect of the present invention allows the TFT panel 100 to be produced only by changing an opening pattern in a contact hole patterning step and without adding any new step to a conventional TFT panel producing steps.

Figure 6:
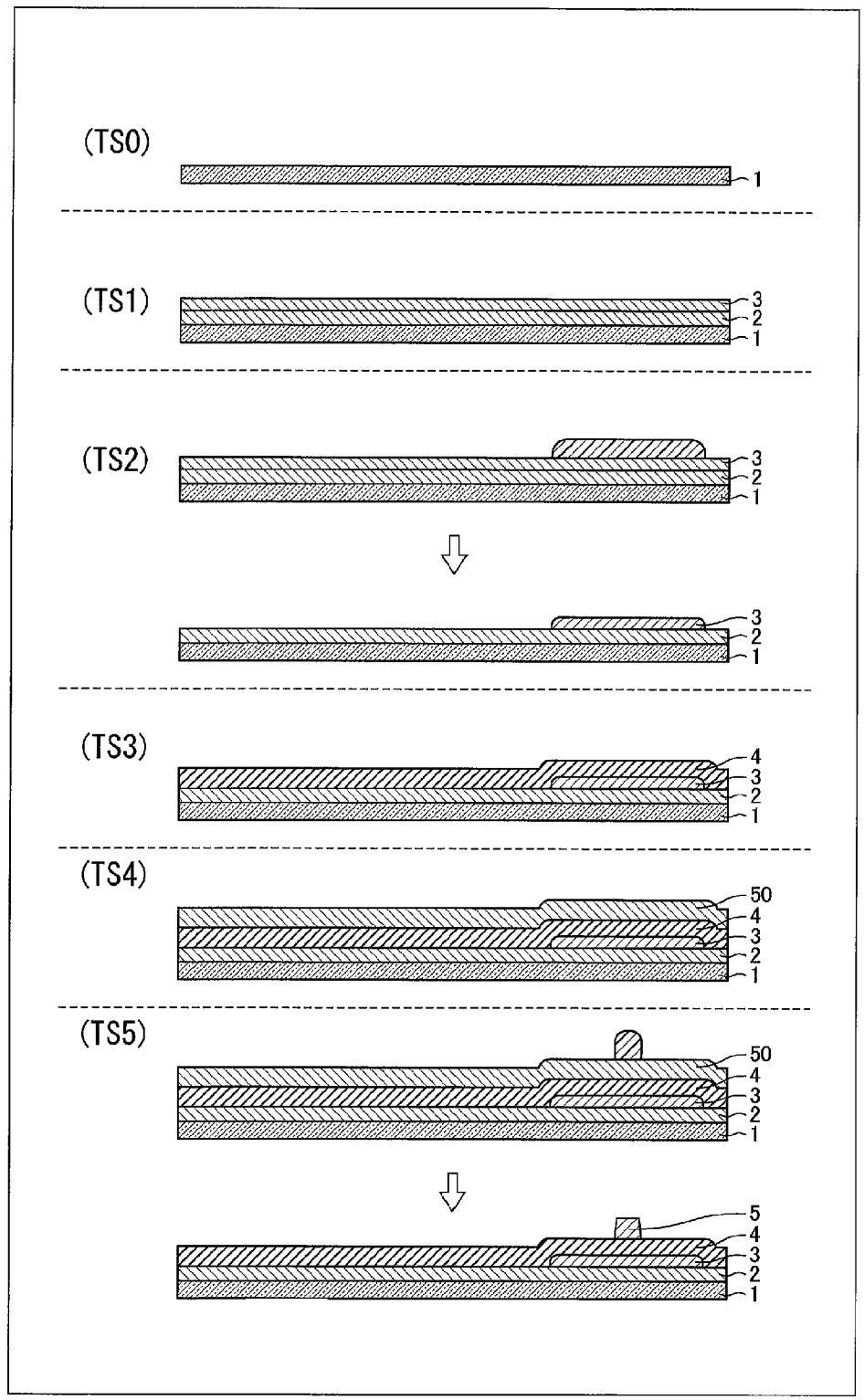
FIG. 6 is a flowchart illustrating part of the steps of producing the substrate device in FIG. 1.
Figure 7:
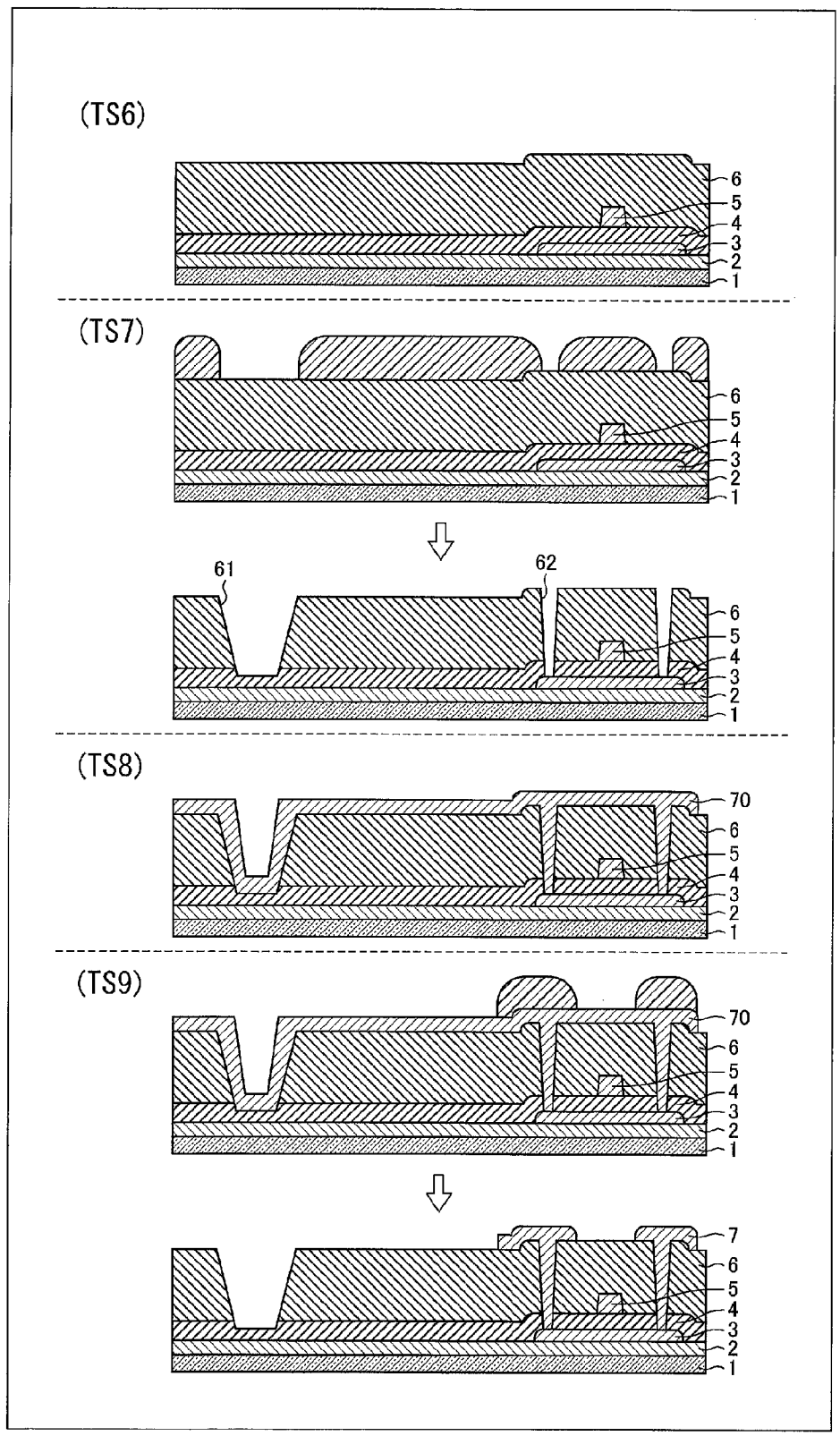
FIG. 7 is a flowchart illustrating the steps of producing the substrate device, which steps follow the steps in FIG. 6.
Figure 8:
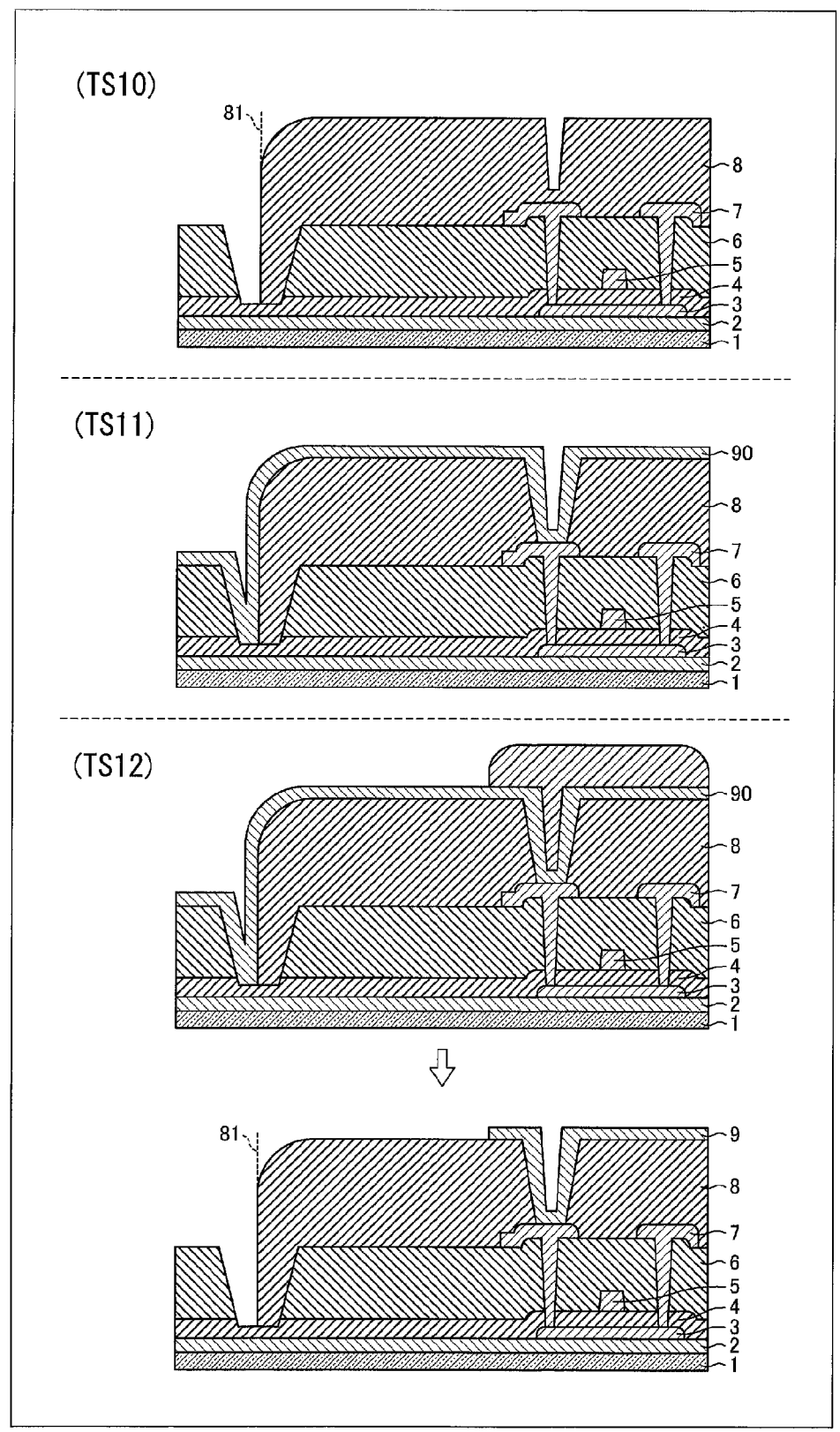
FIG. 8 is a flowchart illustrating the steps of producing the substrate device, which steps follow the steps in FIG. 7.

FIGS. 6 through 8 are flowcharts illustrating steps of producing the top-gate structure TFT panel 100.

Figure 9:
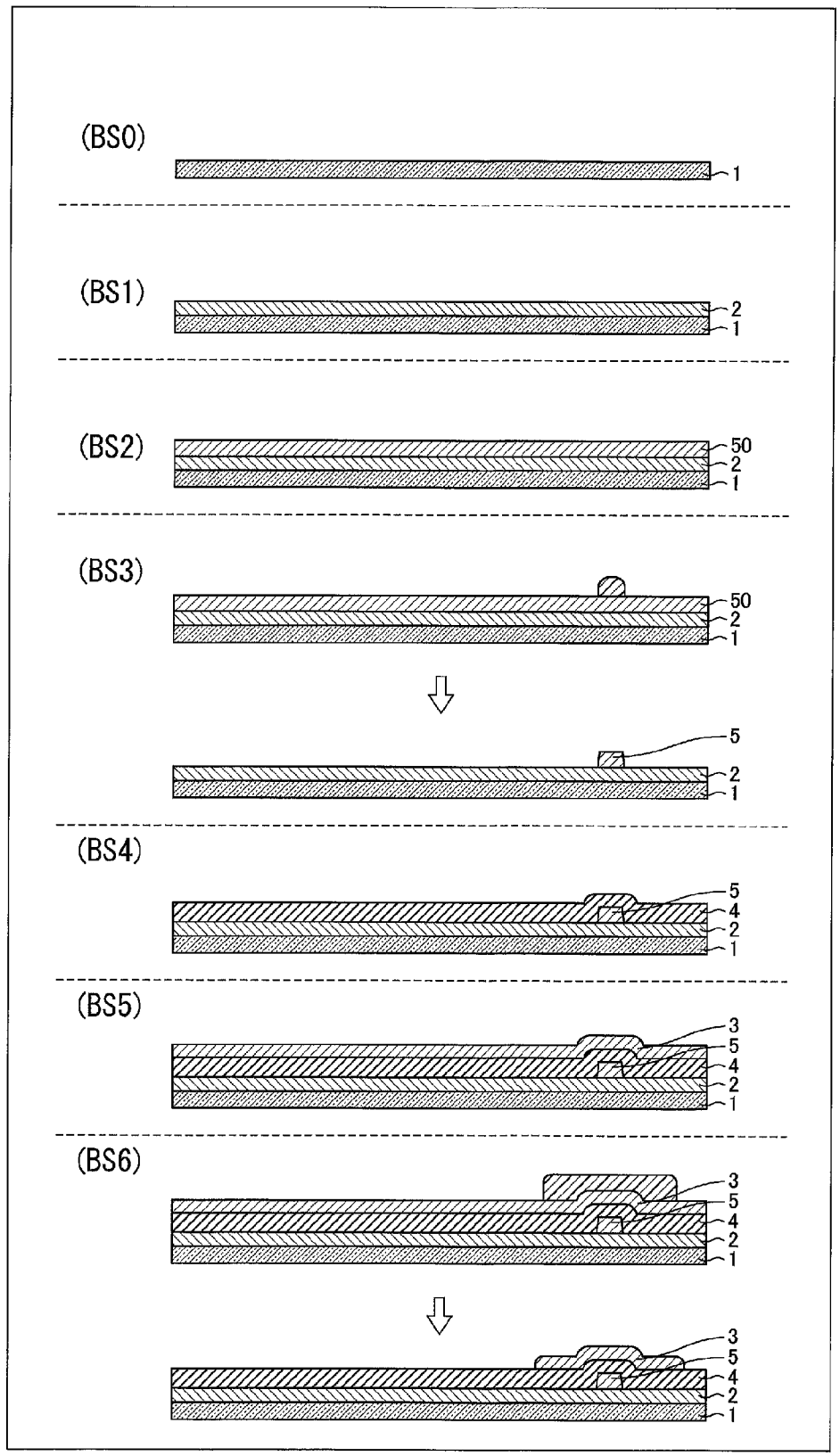
FIG. 9 is a flowchart illustrating part of the steps of producing a substrate device in accordance with another aspect of the present invention.

FIG. 9 is a flowchart illustrating steps of producing a TFT panel 170 which is a bottom-gate structure substrate device, in accordance with another aspect of the present invention.

In order to distinguish the steps of producing the top-gate structure TFT panel 100 from the steps of producing the bottom-gate structure TFT panel 170, "TS" is prefixed to the number indicative of the order of the steps of producing the TFT panel 100. Similarly, "BS" is prefixed to the number indicative of the order of the steps of producing the TFT panel 170. T and B correspond to "top gate" and "bottom gate", respectively. S is an abbreviation of "step".

Note that the following description first discusses the steps of producing the TFT panel 100 with reference to FIGS. 6 through 8, and that the bottom-gate structure TFT panel 170 and the steps of producing the TFT panel 170 will be detailed later.

The TFT panel 100 can be produced by, for example, the following production steps which are illustrated in FIGS. 6 through 8.

As illustrated in FIG. 6, first, a glass substrate 1 is prepared (TS0).

Next, a buffer film 2 (thickness: 100-400 nm, example of material: SiNO/SiO2 laminate film) is formed on the glass substrate 1 by CVD (Chemical Vapor Deposition). Thereafter, a silicon film 3 (thickness: 30-100 nm, example of material: CG (Continuous Grain: continuous grain boundary crystal)-silicon) is formed by CVD and then crystallized (buffer film/silicon film formation and crystallization step TS1).

A resist is patterned by photolithography, and then a silicon pattern is formed by dry etching (silicon patterning step TS2).

A gate insulating film 4 (example of material: SiO2, SiN, SiNO, or laminate film thereof) is formed by CVD (gate insulating film formation step TS3).

A gate electrode film 50 is formed by sputtering (gate electrode film formation step TS4).

A resist is patterned by photolithography, and then the gate electrode film 50 is subjected to dry etching or wet etching so that a pattern of the gate electrode 5 is formed (gate electrode patterning step TS5).

FIG. 7 is a flowchart illustrating the steps of producing the TFT panel 100, which steps follow the steps in FIG. 6.

As illustrated in FIG. 7, an interlayer insulating film 6 (thickness: 300-1000 nm, example of material: SiO2, SiN, SiNO, or laminate film thereof) is formed by CVD (interlayer insulating film formation TS6).

A resist is patterned by photolithography and then the interlayer insulating film 6 is subjected to dry etching or wet etching so that a contact hole 62 is formed. When the contact hole 62 is formed, the interlayer insulating film opening 61 is simultaneously formed by the dry etching or the wet etching (contact hole patterning step TS7).

A data wiring line/terminal wiring line film 70 is formed by sputtering (data wiring lines/terminal wiring lines film formation step TS8: opening step).

A resist is patterned by photolithography, and then the data wiring line/terminal wiring line film 70 is subjected to dry etching or wet etching so that a pattern of the data wiring lines/terminal wiring lines 7 is formed (data wiring line/terminal wiring line patterning step TS9: wiring line formation step).

FIG. 8 is a flowchart illustrating the steps of producing the TFT panel 100, which steps follow the steps in FIG. 7.

As illustrated in FIG. 8, the insulating protective film (organic insulating film, example of material: photosensitive resin film) is patterned by photolithography (insulating protective film formation step TS10: second insulating film formation step).

A transparent electrode film 90 (thickness: 30-150 nm, example of material: ITO, IZO, ZnO) is formed by sputtering (transparent electrode film formation step TS11).

A resist is patterned by photolithography, and then, the transparent electrode film 90 is subjected to wet etching so that a pattern of the transparent electrode 9 is formed (transparent electrode pattern formation step TS12).

As described above, the TFT panel 100 can be produced by simultaneously forming (i) the contact hole 62 in the interlayer insulating film 6 and (ii) an opening in the interlayer insulating film 6 at a position which is to be below a portion of the insulating protective film 8 which portion is to become the pattern edge 81. That is, it is possible to produce the TFT panel 100, merely by changing an opening pattern in the contact hole patterning step without adding any new step to the conventional TFT panel production steps.

With the above production method, a TFT panel in which a current leakage path between the data wiring lines/terminal wiring lines 7 is reliably disconnected can be produced without any additional cost to production costs for conventional general TFT panels. That is, it is possible to improve a production yield by preventing defective TFT panels from being produced without any additional production cost. This consequently makes it possible to produce TFT panels with high quality.

As described above, the present invention relates to formation of an opening pattern of the interlayer insulating film 6 in the TFT panel. Accordingly, in the substrate device in accordance with one aspect of the present invention, the TFT may be an amorphous silicon (a-Si) TFT or may be a low-temperature polysilicon (LPS) TFT. The transparent electrode 9 may be a transparent electrode of a Vertical Alignment (VA) system or a transparent electrode of an In Plane Switching (IPS) system.

(Modification of TFT Panel of Present Invention Having Top-Gate Structure)

So far, a description has been made as to the top-gate structure TFT panel in accordance with one aspect of the present invention, and the TFT panel 100 has been used as an example. The gate insulating film 4 or a buffer film exists at a bottom of the interlayer insulating film opening 61 of the TFT 100. However, the top-gate structure TFT panel in accordance with one aspect of the present invention is not limited to the TFT panel 100 and may be a TFT panel having a structure as follows.

(i. Modification of Top-Gate Structure TFT Panel—Bottom of Interlayer Insulating Film Opening)

The following description will discuss a top-gate structure TFT panel in accordance with another aspect of the present invention, with reference to FIGS. 10 through 17. For convenience, members having the same functions as those described with reference to the drawings in the above Embodiments are given the same reference signs and explanations thereof are omitted.

Figure 10:
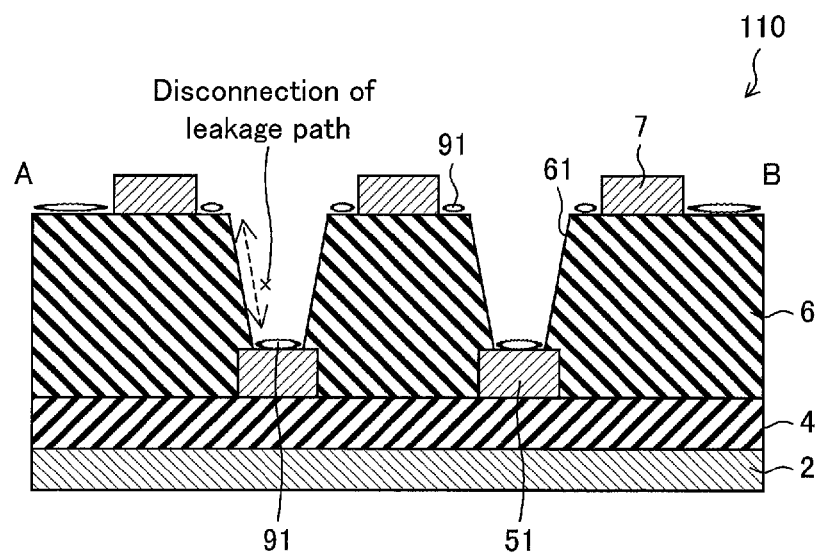
FIG. 10 is a cross sectional view illustrating a substrate device in accordance with still another aspect of the present invention.

FIG. 10 is a cross sectional view illustrating a TFT panel 110 which is a substrate device in accordance with another aspect of the present invention. A bottom of the interlayer insulating film opening 61 which is provided at a position corresponding to the pattern edge 81 of the insulating protective film 8 is provided with a gate wiring line 51. Even in a case where the gate wiring line 51 exists at the bottom of the interlayer insulating film opening 61 due to a level difference formed by the interlayer insulating film opening 61, i.e. a difference in height between a top surface of the interlayer insulating film 6 and the bottom of the interlayer insulating film opening 61, a current leakage path is disconnected reliably.

Note that though the gate wiring line is shown here as an example, a wiring line at the bottom of the interlayer insulating film opening 61 is not limited to the gate wiring line. The wiring line at the bottom of the interlayer insulating film opening 61 may be a wiring line for a peripheral circuit, a drawing wiring line, etc., as long as the wiring line is formed in a layer where the gate wiring line is provided.

Figure 11:
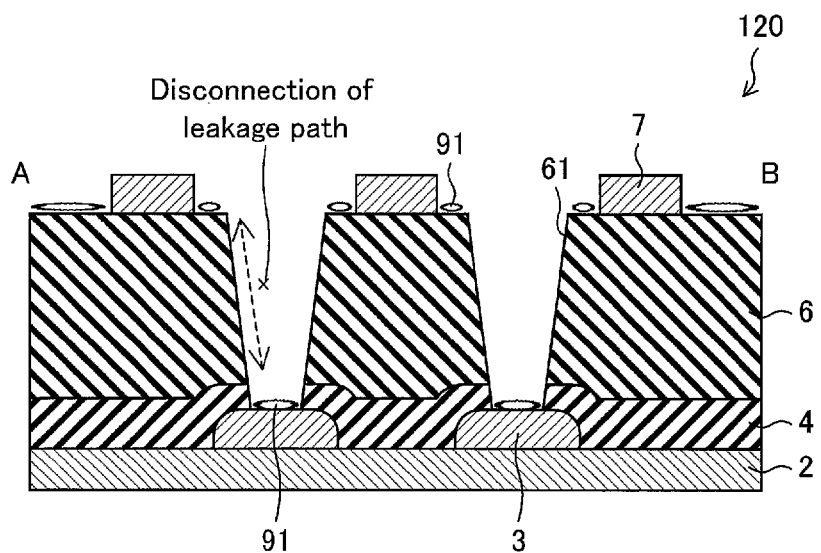
FIG. 11 is cross sectional view illustrating a substrate device in accordance with still another aspect of the present invention.

FIG. 11 is a cross sectional view illustrating a TFT panel 120 which is a substrate device in accordance with another aspect of the present invention. A bottom of the interlayer insulating film opening 61 which is provided at a position corresponding to the pattern edge 81 of the insulating protective film 8 is provided with a silicon film 3. Also in this case, a level difference of the interlayer insulating film opening 61 reliably disconnects a current leakage path, as in the case of the TFT 110 illustrated in FIG. 10.

In each of the TFT panels 100, 110, and 120, a current leakage path is disconnected by the level difference of the interlayer insulating film opening 61, so that no electric short-circuit occurs between adjacent ones of the data wiring lines/terminal wiring lines 7.

In cases of the TFT panels 100, 110, and 120, the interlayer insulating film opening 61 is provided between the data wiring lines/terminal wiring lines 7. However, the interlayer insulating film opening 61 for disconnecting a current leakage path between the data wiring lines/terminal wiring lines 7 is not necessarily provided between the data wiring lines/terminal wiring lines 7.

The following description will discuss a substrate device in accordance with one aspect of the present invention, which substrate device has a structure in which an opening (interlayer insulating film opening 61) is provided at a position corresponding to at least one of two adjacent extending wiring lines of the plurality of wiring lines (data wiring lines/terminal wiring lines 7). The substrate device discussed here as examples are TFT panels 130 through 160. The TFT panels 130 through 160 are each a substrate device in accordance with another aspect of the present invention, in which the interlayer insulating film opening 61 is provided at a position different from that of the TFT panel 100.

(ii. Modification of Top-Gate Structure TFT Panel—Position at which Interlayer Insulating Film Opening is Provided)

Figure 12:
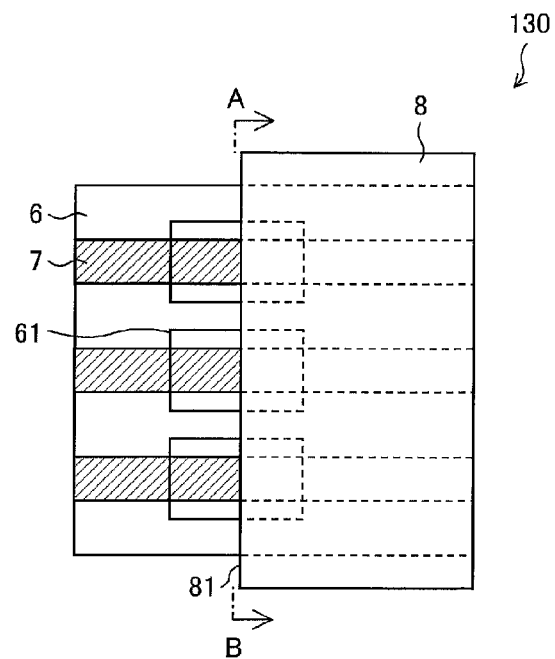
FIG. 12 is a schematic view illustrating a substrate device in accordance with still another aspect of the present invention, viewed directly from above.

FIG. 12 is a schematic view illustrating the TFT panel 130 which is a substrate device in accordance with another aspect of the present invention, viewed directly from above.

In the TFT panel 130, the interlayer insulating film opening 61 is provided to each of the data wiring lines/terminal wiring lines 7, at a position which corresponds to the pattern edge 81 of the insulating protective film 8.

That is, in the TFT panel 130, the interlayer insulating film opening 61 is provided at a position corresponding to an intersection of each of the data wiring lines/terminal wiring lines 7 and the pattern edge 81 of the insulating protective film 8.

Figure 29:
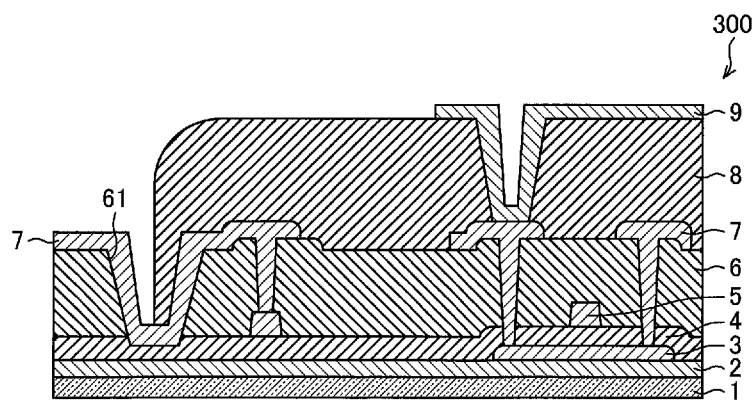
FIG. 29 is a cross sectional view illustrating positions of the interlayer insulating film opening, the data wiring lines/terminal wiring lines, and a pattern edge of the insulating protective film in the TFT panel in FIG. 12.

FIG. 29 is a cross sectional view illustrating positions of the interlayer insulating film opening 61, the data wiring lines/terminal wiring lines 7, and the pattern edge 81 of the insulating protective film 8 in the TFT panel 130.

That is, in the TFT panel 130, the interlayer insulating film opening 61 is provided with respect to each of the data wiring lines/terminal wiring lines 7 which extend on the surface of the interlayer insulating film 6 and which are provided adjacent to each other with a predetermined distance therebetween. Each of the data wiring lines/terminal wiring lines 7 extends (i) across the interlayer insulating film opening 61 which is provided with respect to each of the data wiring lines/terminal wiring lines 7 and (ii) along an inner surface of the interlayer insulating film opening 61.

Figure 13:
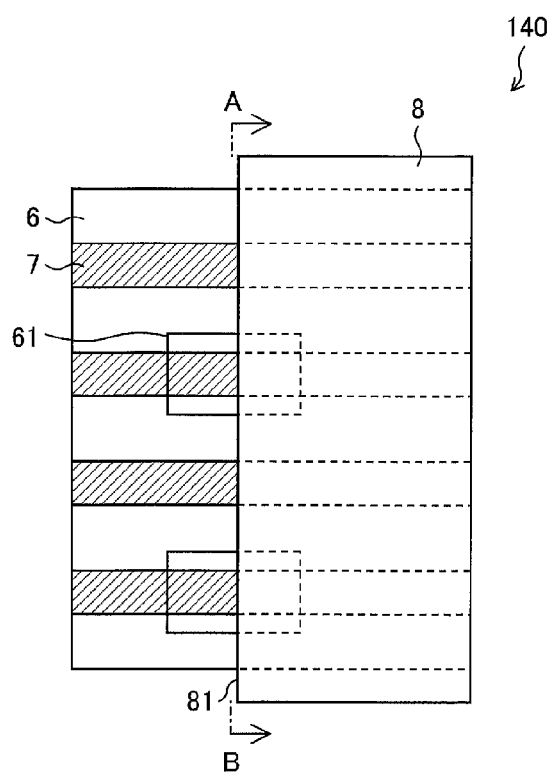
FIG. 13 is a schematic view illustrating a substrate device in accordance with still another aspect of the present invention, viewed directly from above.

FIG. 13 is a schematic view illustrating the TFT panel 140 which is a substrate device in accordance with another aspect of the present invention, viewed directly from above. In the TFT panel 140, the interlayer insulating film opening 61 is provided at a position corresponding to an intersection of (i) each of alternate ones of the data wiring lines/terminal wiring lines 7 and (ii) the pattern edge 81 of the insulating protective film 8.

Figure 14:
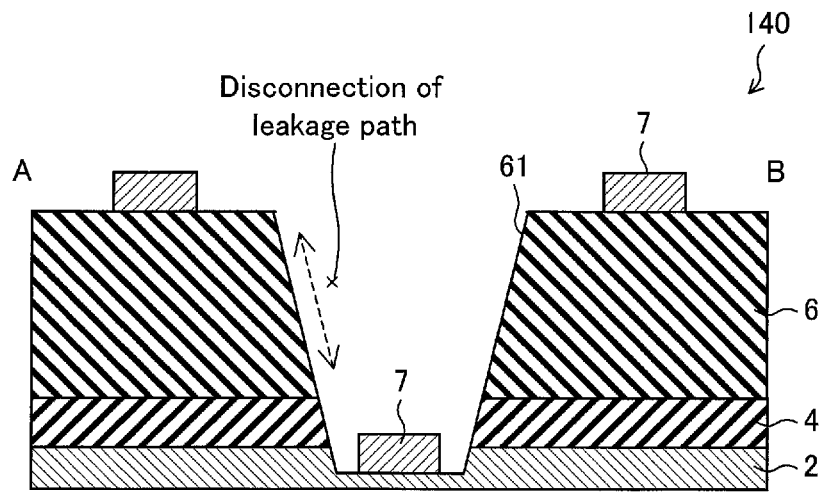
FIG. 14 is a cross sectional view illustrating the substrate device in FIG. 13, which is taken along A-B in FIG. 13.

FIG. 14 is a cross sectional view illustrating the TFT panel 140 taken along A-B in FIG. 13.

Figure 15:
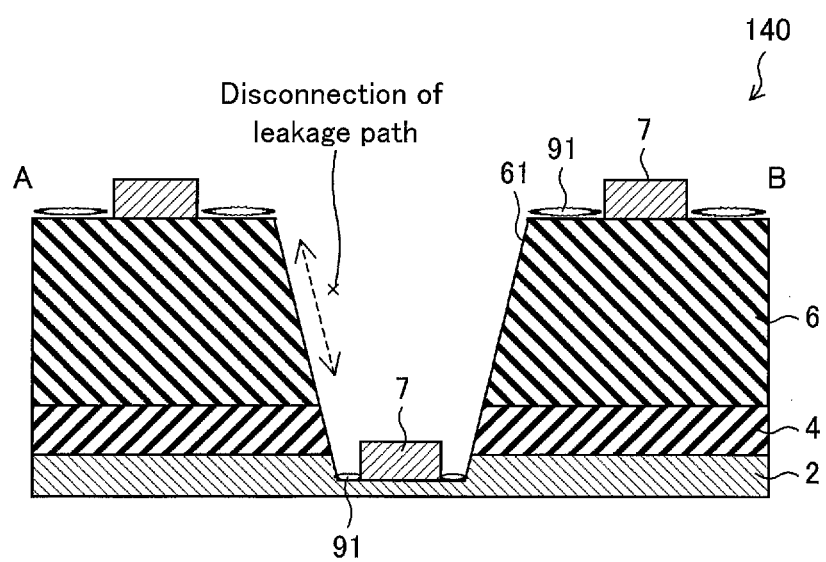
FIG. 15 is a cross sectional view illustrating the substrate device in FIG. 13, which is taken along A-B in FIG. 13.

FIG. 15 is a cross sectional view illustrating the TFT panel 140 in FIG. 13 in which the transparent electrode film residue 91 remains at the bottom of the interlayer insulating film opening 61.

Figure 16:
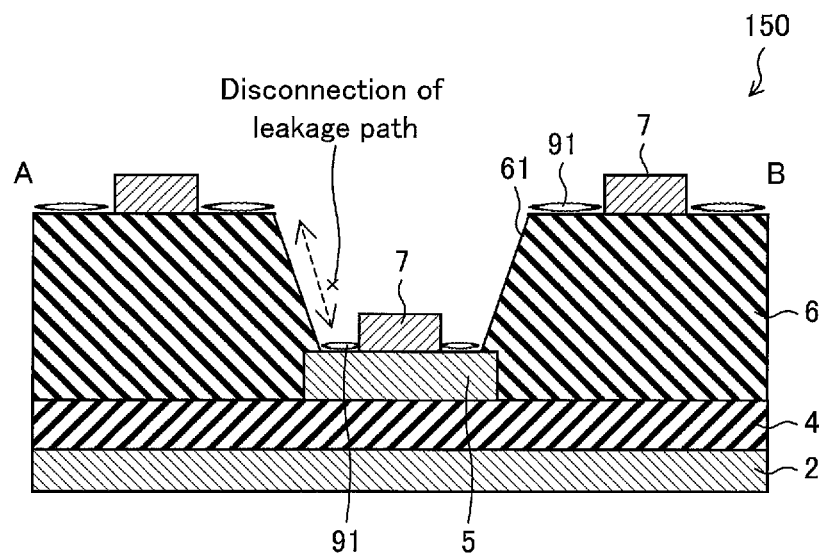
FIG. 16 is a cross sectional view illustrating a substrate device in which an interlayer insulating film opening is provided with respect to alternate data wiring lines/terminal wiring lines as in the substrate device in FIG. 13, and a gate electrode exists at a bottom of the interlayer insulating film opening.

FIG. 16 is a cross sectional view illustrating the TFT panel 150 which is a substrate device in accordance with another aspect of the present invention. In the TFT panel 150, the interlayer insulating film opening 61 is provided with respect to alternate ones of the wiring lines/terminal wiring lines 7, as in the TFT panel 140, and the gate electrode 5 exists at the bottom of the interlayer insulating film opening 61.

Figure 17:
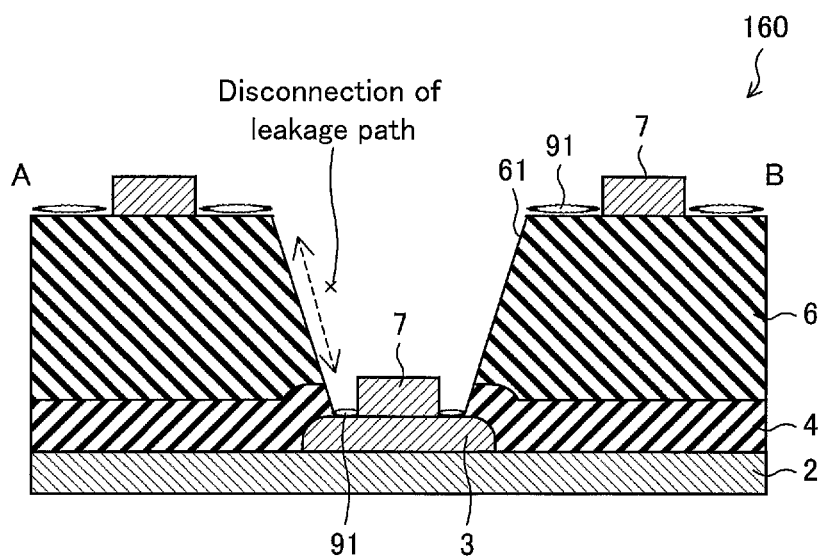
FIG. 17 is a cross sectional view illustrating a substrate device in which an interlayer insulating film opening is provided with respect to alternate data wiring lines/terminal wiring lines as in the substrate device in FIG. 13, and a silicon film exists at a bottom of the interlayer insulating film opening.

FIG. 17 is a cross sectional view illustrating the TFT panel 160 which is a substrate device in accordance with another aspect of the present invention. In the TFT panel 160, the interlayer insulating film opening 61 is provided with respect to alternate ones of the data wiring lines/terminal wiring lines 7 as in the TFT panel 140, and the silicon film 3 exists at the bottom of the interlayer insulating film opening 61.

In the TFT panel 130, the interlayer insulating film opening 61 is provided with respect to each of the data wiring lines/terminal wiring lines 7. On the other hand, in the TFT panels 150 and 160, the interlayer insulating film opening 61 is provided with respect to alternate ones of the data wiring lines/terminal wiring lines 7. In each of the TFT panels 140, 150, and 160, the interlayer insulating film 6 has an opening which is provided as if the opening covers the data wiring lines/terminal wiring lines 7.

In each of the TFT panels 140, 150, and 160, a current leakage path between adjacent ones of the data wiring lines/terminal wiring lines 7 is disconnected by the level difference of the interlayer insulating film opening 61, so that an electric short-circuit therebetween does not occur.

As is clear from the TFT panels 140, 150, and 160, the substrate device in accordance with one aspect of the present invention may be configured such that the interlayer insulating film opening 61 forms a level difference between adjacent ones of the data wiring lines/terminal wiring lines 7.

The structure of each of the TFT panels 140, 150, and 160 which are substrate devices in accordance with one aspect of the present invention can also be expressed as follows. The interlayer insulating film opening 61 is provided between adjacent ones of the data wiring lines/terminal wiring lines 7 which ones extend on a surface of the interlayer insulating film 6 with a predetermined distance therebetween. Further, there is provided, at the bottom of the interlayer insulating film opening 61, another data wiring line/terminal wiring line 7 which is different from the adjacent ones of the data wiring lines/terminal wiring lines 7 which ones extend on the surface of the interlayer insulating film 6 with the predetermined distance therebetween. In other words, the data wiring lines/terminal wiring lines 7 are adjacently provided with a predetermined distance therebetween so as to extend on the surface of the interlayer insulating film 6. The interlayer insulating film opening 61 is provided between the data wiring lines/terminal wiring lines 7. Furthermore, at the bottom of the interlayer insulating film opening 61, there is provided a data wiring line/terminal wiring line 7 which is different from the data wiring lines/terminal wiring lines 7 which are adjacently provided with the predetermined distance therebetween so as to extend on the surface of the interlayer insulating film 6.

As already confirmed above, also in the TFT panels 100, 110, 120, and 130, the level difference formed by the interlayer insulating film opening 61 disconnects a current leakage circuit between the data wiring lines/terminal wiring lines 7. That is, the TFT panels 100 through 130 are different from the TFT 140 through 160 in position at which the interlayer insulating film opening 61 is provided. In each of the TFT panels, a current leakage circuit between the data wiring lines/terminal wiring lines 7 is disconnected by the level difference formed by the interlayer insulating film opening 61.

[Second Embodiment]

The TFT panels 100 through 160 which have been described above are each a top-gate structure TFT panel.

However, the problems of (i) a transparent electrode film residue which is formed along a pattern edge of an insulating protective film and (ii) formation of a current leakage path between data wiring lines/terminal wiring lines by the transparent electrode film residue are not limited to the top-gate structure TFT panel.

Figure 19:
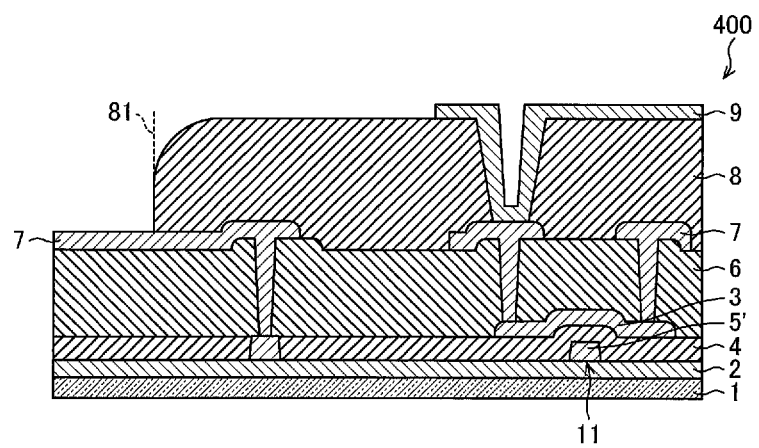
FIG. 19 is a cross sectional view illustrating an ideal bottom-gate structure substrate device.

FIG. 19 is a cross sectional view illustrating a structure of an ideal bottom-gate structure TFT panel 400. The TFT panel 400 is different only in configuration of a transistor from an ideal top-gate structure TFT panel 300 (FIG. 20).

As illustrated in FIG. 19, the TFT panel 400 includes a bottom-gate structure thin film transistor 11. The thin film transistor 11 includes a silicon film 3, data wiring lines/terminal wiring lines 7 electrically connected with the silicon film 3, a gate insulating film 4, and a gate electrode 5' which is covered with the gate insulating film 4. A drain electrode of the thin film transistor 11 is electrically connected with the silicon film 3 and the transparent electrode 9.

In general, also in production of a bottom-gate structure TFT panel, a thick insulating protective film (organic resin film in general) is stacked on data wiring lines/terminal wiring lines and then a pattern of a conductive film (transparent electrode film) is formed thereon, as in production of a top-gate structure TFT panel.

Accordingly, as is clear from the shape of the insulating protective film 8 in the bottom-gate structure TFT panel 400 illustrated in FIG. 19, stacking the thick insulating protective film 8 on the data wiring lines/terminal wiring lines 7 results in occurrence of the transparent electrode film residue 91 along the pattern edge 81 of the insulating protective film 8.

That is, the present invention is applicable to a bottom-gate structure TFT panel. In the present invention, an opening is provided in an interlayer insulating film of a TFT panel so as to exist along a pattern edge of an insulating protective film and thereby, a current leakage path between data wiring lines/terminal wiring lines is disconnected.

Figure 18:
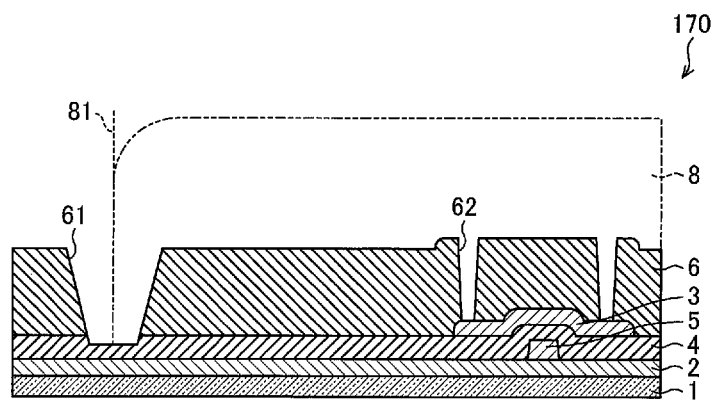
FIG. 18 is a cross sectional view illustrating a substrate device in accordance with another aspect of the present invention.

With reference to FIGS. 18 and 9, the following description will discuss a TFT panel 170 which is a bottom-gate structure substrate device in accordance with another aspect of the present invention. For convenience, members having the same functions as those explained with reference to the drawings in First Embodiment are given the same reference signs and explanations thereof are omitted.

(Bottom-Gate Structure TFT Panel 170 of the Present Invention)

FIG. 18 is a cross sectional view illustrating the TFT panel 170 in accordance with another aspect of the present invention.

The TFT panel 170 is a bottom-gate structure TFT panel. The TFT panel 170 is different only in a configuration of a transistor from the TFT panel 100.

Also in a case of the TFT panel 170, at the time when a contact hole 62 is formed in an interlayer insulating film 6, an interlayer insulating film opening 61 is formed at a position of the interlayer insulating film 6 which position corresponds to a pattern edge of an insulating protective film 8.

The following description will discuss steps of producing the TFT panel 170 in details.

(Method for Producing TFT Panel 170)

FIG. 9 is a flowchart illustrating the steps of producing the TFT panel 170.

In the description regarding the steps of producing the TFT panel 170, in order to distinguish the steps of producing the TFT panel 170 from the steps of producing the top-gate structure TFT panel 100, "BS" is prefixed to the number indicative of the order of the steps producing the TFT panel 170.

The TFT panel 170 can be produced by, for example, the following steps which are illustrated in FIG. 9.

First, a glass substrate 1 is prepared (BS0).

Next, a buffer film 2 (thickness: 100-400 nm, example of material: SiNO/SiO2 laminate film) is formed on the glass substrate 1 by CVD (buffer film formation step BS1). It should be noted, however, that provision of the buffer film 2 is not essential, and the TFT panel 170 does not necessarily include the buffer film 2. That is, in the method of producing the substrate device in accordance with one aspect of the present invention, the buffer film formation step BS1 may be omitted.

A gate electrode film 50 is formed by sputtering (gate electrode film formation step BS2).

A resist is patterned by photolithography, and then the gate electrode film 50 is subjected to dry etching or wet etching so that a pattern of a gate electrode 5 is formed (gate electrode patterning step BS3).

A gate insulating film 4 (example of material: SiO2, SiN, SiNO, or laminate film thereof) is formed by CVD (gate insulating film formation step BS4).

A silicon film 3 (thickness: 30-100 nm, example of material: CG-silicon) is formed by CVD and then crystallized (silicon film formation and crystallization step BS5).

A resist is patterned by photolithography, and then the silicon film 3 is subjected to dry etching so that a silicon pattern is formed (silicon patterning step BS6).

Subsequent steps, i.e. an interlayer insulating film formation step BS7 and its subsequent steps, are the same as the interlayer insulating film formation step TS6 and its subsequent steps in the steps of producing the top-gate structure TFT panel 100, and accordingly explanations thereof are omitted. That is, the method for producing a bottom-gate structure substrate device in accordance with one aspect of the present invention includes the contact hole patterning step TS7 (opening step), the data wiring line/terminal wiring line patterning step TS9 (wiring line formation step), and the insulating protective film formation step TS10 (second insulating film formation step), as with the method for producing a top-gate structure substrate device, which method has been already described above.

As described above, in the TFT panel 170 as well as in the TFT panel 100, when the contact hole 62 is formed in the interlayer insulating film 6, an opening is formed at the same time in the interlayer insulating film 6 at a position which is to be below a portion of the insulating protective film 8 which portion to become the pattern edge 81.

Therefore, the above production method allows a TFT panel, in which a current leakage circuit between the data wiring lines/terminal wiring lines 7 is reliably disconnected, to be produced without any additional cost in addition to production costs for a conventional and general TFT panel. That is, the above production method allows improving a production yield by reducing production of deficient TFT panels without additional production cost, thereby allowing production of TFT panels with high quality.

[Note on Scope of Present Embodiment]

As described above, the present embodiment relates to formation of an opening pattern in an interlayer insulating film of a TFT panel. Accordingly, a structure and a type of a TFT may be an amorphous silicon TFT or may be a low-temperature polysilicon TFT. A transparent electrode portion may be an electrode portion of a vertical alignment system or an electrode portion of a horizontal alignment type.

Furthermore, the interlayer insulating film of the substrate device in accordance with one aspect of the present invention has an opening at a position corresponding to a pattern edge of the insulating protective film.

As a result of provision of the opening, a conductive film residue (transparent electrode film residue) having occurred along a pattern edge of the insulating protective film is accumulated at the bottom of the opening. This prevents formation of a current leakage path between the data wiring lines/terminal wiring lines. That is, the substrate device in accordance with one aspect of the present invention may have a level difference formed by the opening between adjacent data wiring lines/terminal wiring lines. The level difference formed by the opening disconnects the current leakage path between the data wiring lines/terminal wiring lines.

Therefore, the opening may be provided at a position which allows the opening to form a level difference between data wiring lines/terminal wiring lines.

Specifically, the substrate device in accordance with one aspect of the present invention has an opening in the interlayer insulating film between the data wiring lines/terminal wiring lines. This allows a current leakage circuit between the data wiring lines/terminal wiring lines to be disconnected even when a conductive film residue occurs. The position at which the opening is provided in the interlayer insulating film is not limited to a space between the data wiring lines/terminal wiring lines. Alternatively, the opening may be provided with respect to each of the data wiring lines/terminal wiring lines, or may be provided with respect to alternate data wiring lines/terminal wiring lines. In either case, a conductive film residue (transparent electrode film residue) having occurred between the data wiring lines/terminal wiring lines and along the pattern edge of the insulating protective film is accumulated at the bottom of the opening, and a level difference formed by the opening disconnects the current leakage circuit between the data wiring lines/terminal wiring lines.

Furthermore, since the current leakage path between the adjacent data wiring lines/terminal wiring lines is disconnected by the level difference formed by the opening, the bottom of the opening may be provided with a gate insulating film, a buffer insulating film, a gate wiring line connected with a thin film transistor or a wiring line in a layer where the gate wiring line is provided, or a silicon film which forms a thin film transistor.

In the method for producing a substrate device in accordance with one aspect of the present invention, when a contact hole is formed in the interlayer insulating film, an opening is formed in the interlayer insulating film at a position which is to be below a portion of the insulating protective film which portion is to become the pattern edge. Therefore, merely by changing an opening pattern in the interlayer insulating film without adding any new step to the conventional TFT panel producing steps in which a contact hole for data wiring lines/terminal wiring lines is provided in the interlayer insulating film, it is possible to produce a substrate device (TFT panel in particular) in which a current leakage circuit between the data wiring lines/terminal wiring lines is reliably disconnected.

The substrate device produced by the method for producing a substrate device in accordance with one aspect of the present invention may be a substrate device having a top-gate thin film transistor or a substrate device having a bottom-gate thin film transistor. It naturally follows that the substrate device in accordance with one aspect of the present invention may be a substrate device having a top-gate thin film transistor or a substrate device having a bottom-gate thin film transistor.

[Summary]

A substrate device (TFT panel 100) in accordance with one aspect of the present invention is a substrate device including: a first insulating film (interlayer insulating film 6); a plurality of wiring lines (data wiring lines/terminal wiring lines 7) which extend on a surface of the first insulating film (interlayer insulating film 6), the plurality of wiring lines being adjacent to each other so as to have a predetermined distance therebetween; a second insulating film (insulating protective film 8) which covers all of respective portions of the plurality of wiring lines, so that a slope (insulating protective film pattern edge 81) of the second insulating film is formed on the plurality of wiring lines, the respective portions of the plurality of wiring lines each having a length that is a part of an entire length of each of the plurality of wiring lines; and a conductive pattern (transparent electrode 9) formed on a surface of the second insulating film, the surface of the first insulating film having an opening (interlayer insulating film opening 61) which is provided at a position (1) that corresponds to the slope of the second insulating film and (2-a) that corresponds to at least one of two adjacently extending wiring lines of the plurality of wiring lines or (2-b) that is between two adjacently extending wiring lines of the plurality of wiring lines.

With the arrangement, the opening provided on the surface of the first insulating film forms, at a position corresponding to the slope of the second insulating film, a level difference between two adjacent extending wiring lines. An aspect of the level difference changes in accordance with a change in positional relationship between the wiring line and the opening which is described as the item (1) or (2) above.

As a result of provision of such an opening, even when a residue of a conductive film for the conductive pattern (transparent electrode film residue 91) has occurred along the slope of the second insulating film, the residue moves to the bottom of the opening.

Consequently, the residue between the wiring lines, which has occurred along the slope of the second insulating film, moves to the bottom of the opening. Thus, a level difference formed by the opening reliably disconnects a current leakage path between the wiring lines which path might be formed by the residue.

The substrate device (TFT panel 100) in accordance with one aspect of the present invention may be arranged so as to further include, at a bottom part of the opening (interlayer insulating film opening 61), (i) a gate insulating film (4) which constitutes a thin film transistor or (ii) a buffer film (2).

The substrate device (TFT panel 110) in accordance with one aspect of the present invention may be arranged so as to further include, at a bottom part of the opening (interlayer insulating film opening 61), (i) a gate wiring line (51) connected with a thin film transistor or (ii) a wiring line in a layer where the gate wiring line (51) is provided.

The substrate device (TFT panel 120) in accordance with the present invention may be arranged so as to further include, at a bottom part of the opening (interlayer insulating film opening 61), a silicon film which constitutes a thin film transistor.

With the arrangement of the substrate device (TFT panel 100, 110, 120), the residue between the wiring lines, which has occurred along the slope of the second insulating film, moves to the bottom of the opening at which bottom the silicon film is provided. This reliably disconnects a current leakage path between the wiring lines which path might be formed by the residue.

Therefore, the above arrangement can improve reliability of particularly a display panel which uses a thin film transistor as a switching element.

In the above arrangement, in a case where the opening (interlayer insulating film opening 61) is provided with respect to alternate data wiring lines, it is possible to reduce the number of the opening (interlayer insulating film opening 61) to be provided.

In the above arrangement, a structure of layers below the data wiring line at the bottom of the opening (interlayer insulating film opening 61) can be changed as appropriate. That is, in the arrangement, the structure of the layers below the data wiring line does not influence (i) the electrical disconnection and (ii) reduction in the number of the opening (interlayer insulating film opening 61) provided.

The substrate device (TFT panel 130) in accordance with one aspect of the present invention may be arranged such that: the opening (interlayer insulating film opening 61) is provided so as to correspond to each of the plurality of wiring lines (data wiring lines/terminal wiring lines 7) which extend on the surface of the first insulating film (interlayer insulating film 6), the plurality of wiring lines being adjacent to each other so as to have the predetermined distance therebetween; and each of the plurality of wiring lines (data wiring lines/terminal wiring lines 7) extends across the opening (interlayer insulating film opening 61) along an inner surface of the opening.

With the arrangement, the residue of the conductive film for the conductive pattern is accumulated at the bottom of the opening, and the level difference formed by the opening provided with respect to each of the wiring lines reliably disconnects a current leakage circuit between adjacent wiring lines extending on the surface of the first insulating film with a predetermined distance therebetween.

A method for producing a substrate device in accordance with one aspect of the present invention is a method for producing a substrate device, the substrate device including: a first insulating film (interlayer insulating film 6); a plurality of wiring lines (data wiring lines/terminal wiring lines 7) which extend on a surface of the first insulating film (interlayer insulating film 6), the plurality of wiring lines being adjacent to each other so as to have a predetermined distance therebetween; a second insulating film (insulating protective film 8) which covers all of respective portions of the plurality of wiring lines, so that a slop (insulating protective film pattern edge 81) of the second insulating film is formed on the plurality of wiring lines, the respective portions of the plurality of wiring lines each having a length that is a part of an entire length of each of the plurality of wiring lines; and a conductive pattern (transparent electrode 9) formed on a surface of the second insulating film (insulating protective film), the method including the steps of: forming, on the surface of the first insulating film, an opening in such a manner that the opening is provided at a position (1) that corresponds to the slope of the second insulating film and (2-a) that corresponds to at least one of two adjacently extending wiring lines of the plurality of wiring lines or (2-b) that is between two adjacently extending wiring lines of the plurality of wiring lines (contact hole patterning step TS7); forming, on the surface of the first insulating film, the plurality of wiring lines extending so that the plurality of wiring lines are adjacent to each other with the predetermined distance therebetween; and forming the second insulating film which covers all of respective portions of the plurality of wiring lines in such a manner that the slope of the second insulating film is formed on the plurality of wiring lines, and the slope reaches inside the opening.

With the above production method, it is possible to produce a substrate device in which a current leakage path between the wiring lines is disconnected reliably.

Application of the above production method to production of a TFT panel makes it possible to produce a TFT panel in which a current leakage circuit is disconnected reliably, merely by changing the opening pattern of the first insulating film without adding any new step to the steps of producing a conventional TFT panel in which a contact hole for the wiring lines is provided in the first insulating film.

That is, the production method neither requires any additional production cost nor complicates the production steps. Meanwhile, the production method improves a production yield by preventing defective TFT panels from being produced, thereby allowing production of TFT panels with high quality.

The wiring line may be formed to extend across the opening along an inner surface of the opening or may be formed to avoid the opening.

The number of the opening may be two or more. In a case of forming a plurality of openings on the surface of the first insulating film, the plurality of openings may be provided at a predetermined interval on the surface of the first insulating film in such a manner as to be along the slope of the second insulating film. In this embodiment, all of a plurality of wiring lines may be formed in such a manner as to extend across openings corresponding to respective wiring lines and along respective inner surfaces of the openings. Alternatively, a wiring line formed only on the surface of the first insulating film and a wiring line extending across the opening may be provided alternately.

The present invention is not limited to the description of the embodiments above, but may be altered by a skilled person within the scope of the claims. An embodiment based on a proper combination of technical means disclosed in different embodiments is encompassed in the technical scope of the present invention. Furthermore, a new technical feature can be made by combining technical means disclosed in individual embodiments.

INDUSTRIAL APPLICABILITY

The present invention is useful for a substrate device and a method for producing the substrate device. In particular, the present invention is preferably applicable to a TFT panel and a method for producing the TFT panel.

REFERENCE SIGNS LIST

2 Buffer film
3 Silicon film
4 Gate insulating film
5 Gate electrode
5' Gate electrode
6 Interlayer insulating film (first insulating film)
7 Data wiring line/terminal wiring line (wiring line)
8 Insulating protective film (second insulating film)
9 Transparent electrode (conductive pattern)
10 Thin film transistor
11 Thin film transistor
51 Gate wiring line
61 Interlayer insulating film opening (opening)
62 Contact hole
81 Insulating protective film pattern edge (slope)
90 Transparent electrode film
91 Transparent electrode film residue
100 TFT panel (substrate device)
110 TFT panel (substrate device)
120 TFT panel (substrate device)
130 TFT panel (substrate device)
140 TFT panel (substrate device)
150 TFT panel (substrate device)
160 TFT panel (substrate device)
170 TFT panel (substrate device)
TS7 Contact hole patterning step (opening step)
TS9 Data wiring/terminal wiring patterning step (wiring formation step)
TS10 Insulating protective film formation step (second insulating film formation step)

The invention claimed is:

1. A substrate device comprising:
a first insulating film;
a plurality of wiring lines which extend on a surface of the first insulating film, the plurality of wiring lines being adjacent to each other so as to have a predetermined distance therebetween;
a second insulating film which covers all of respective portions of the plurality of wiring lines, so that a slope of the second insulating film is formed on the plurality of wiring lines, the respective portions of the plurality of wiring lines each having a length that is a part of an entire length of each of the plurality of wiring lines; and
a conductive pattern formed on a surface of the second insulating film,
the surface of the first insulating film having an opening which is provided at a position (1) that corresponds to the slope of the second insulating film and (2-a) that corresponds to at least one of two adjacently extending wiring lines of the plurality of wiring lines or (2-b) that is between two adjacently extending wiring lines of the plurality of wiring lines.

2. The substrate device as set forth in claim 1, further comprising, at a bottom part of the opening, (i) a gate insulating film which constitutes a thin film transistor or (ii) a buffer film.

3. The substrate device as set forth in claim 1, further comprising, at a bottom part of the opening, (i) a gate wiring line connected with a thin film transistor or (ii) a wiring line in a layer where the gate wiring line is provided.

4. The substrate device as set forth in claim 1, further comprising, at a bottom part of the opening, a silicon film which constitutes a thin film transistor.

5. The substrate device as set forth in claim 1, wherein:
the opening is provided so as to correspond to each of the plurality of wiring lines which extend on the surface of the first insulating film, the plurality of wiring lines being adjacent to each other so as to have the predetermined distance therebetween; and
each of the plurality of wiring lines extends across the opening along an inner surface of the opening.

* * * * *